(12) United States Patent
Smith et al.

(10) Patent No.: US 10,923,244 B2
(45) Date of Patent: Feb. 16, 2021

(54) PHOSPHOR SCREEN FOR MEMS IMAGE INTENSIFIERS

(71) Applicant: ELBIT SYSTEMS OF AMERICA, LLC, Fort Worth, TX (US)

(72) Inventors: Arlynn W. Smith, Blue Ridge, VA (US); Dan CHiLCOTT, Buchanan, VA (US)

(73) Assignee: Elbit Systems of America, LLC, Fort Worth, TX (US)

( * ) Notice: Subject to any disclaimer, the term of this patent is extended or adjusted under 35 U.S.C. 154(b) by 17 days.

(21) Appl. No.: 15/827,956

(22) Filed: Nov. 30, 2017

(65) Prior Publication Data

US 2019/0164659 A1 May 30, 2019

(51) Int. Cl.

| | |
|---|---|
| *G21K 4/00* | (2006.01) |
| *C23C 16/04* | (2006.01) |
| *C23C 16/56* | (2006.01) |
| *G02B 23/12* | (2006.01) |
| *G02F 1/21* | (2006.01) |
| *H01J 43/24* | (2006.01) |
| *F41G 1/32* | (2006.01) |
| *H01J 31/50* | (2006.01) |

(52) U.S. Cl.
CPC ............ *G21K 4/00* (2013.01); *C23C 16/04* (2013.01); *C23C 16/56* (2013.01); *G02B 23/12* (2013.01); *F41G 1/32* (2013.01); *G02F 1/218* (2013.01); *G21K 2004/06* (2013.01); *H01J 31/50* (2013.01); *H01J 43/246* (2013.01); *H01J 2231/5016* (2013.01); *H01J 2237/24435* (2013.01)

(58) Field of Classification Search
CPC ............ H01J 43/246; H01J 31/50; H01J 2237/24435; H01J 2231/5016; G02F 1/218; F41G 1/32; G21K 4/00; G21K 2004/06; C23C 16/04; C23C 16/56
USPC .................................................. 250/483.1
See application file for complete search history.

(56) References Cited

U.S. PATENT DOCUMENTS

| | | | |
|---|---|---|---|
| 3,855,035 A | * | 12/1974 | Bates, Jr. ............... B32B 15/08 156/276 |
| 3,887,724 A | | 6/1975 | Diakides |
| 4,264,408 A | | 4/1981 | Benham |
| (Continued) | | | |

OTHER PUBLICATIONS

Lee, Y.H., et al., "Thin Film Phosphor Prepared by Physical Vapour Deposition for FED Application," IEEE 9th International Vacuum Microelectronics Conference, St. Petersburg (1996).
(Continued)

*Primary Examiner* — Taeho Jo
(74) *Attorney, Agent, or Firm* — K&L Gates LLP

(57) ABSTRACT

A phosphor screen for a Micro-Electro-Mechanical-Systems (MEMS) image intensifier includes a wafer structure, a lattice of interior walls, a thin film phosphor layer, and a reflective metal layer. The wafer structure has a naturally opaque top layer and an active area defined within the naturally opaque top layer. The lattice of interior walls is formed, within the active area, from the naturally opaque top layer. The thin film phosphor layer is disposed in the active area, between the lattice of interior walls. The reflective metal layer that is disposed atop the thin film phosphor layer. In at least some instances, the thin film phosphor layer is a non-particle phosphor layer.

19 Claims, 4 Drawing Sheets

(56) References Cited

U.S. PATENT DOCUMENTS

| | | | |
|---|---|---|---|
| 4,654,558 A | 3/1987 | Obata et al. | |
| 5,127,080 A | 6/1992 | Duggan, Sr. | |
| 5,137,598 A | 8/1992 | Thomas | |
| 5,234,484 A * | 8/1993 | Toch | C23C 14/58 219/405 |
| 5,360,630 A * | 11/1994 | Thomas | C09K 11/567 427/157 |
| 5,554,449 A * | 9/1996 | Tonomura | H05B 33/22 428/690 |
| 5,594,253 A * | 1/1997 | Bueno | G01T 1/201 250/367 |
| 5,636,299 A * | 6/1997 | Bueno | G01T 1/201 250/367 |
| 5,725,787 A * | 3/1998 | Curtin | H01J 9/14 205/122 |
| 5,859,494 A | 1/1999 | Jeong | |
| 5,871,873 A | 2/1999 | Van Doorn et al. | |
| 5,952,665 A * | 9/1999 | Bhargava | G01T 1/20 250/361 R |
| 6,005,239 A * | 12/1999 | Suzuki | G02B 6/08 250/207 |
| 6,300,640 B1 * | 10/2001 | Bhargava | G01T 1/20 250/361 R |
| 6,311,001 B1 * | 10/2001 | Rosine | C03B 37/028 385/120 |
| 6,384,527 B1 | 5/2002 | Spindt et al. | |
| 6,452,184 B1 * | 9/2002 | Taskar | G01T 1/20 250/367 |
| 8,928,021 B1 * | 1/2015 | Bibl | H01L 24/24 257/98 |
| 89,933,419 | 1/2015 | Nuetzel et al. | |
| 2001/0017344 A1 * | 8/2001 | Aebi | H01L 27/14609 250/214 VT |
| 2002/0074929 A1 * | 6/2002 | Taskar | G01T 1/2921 313/467 |
| 2002/0197456 A1 * | 12/2002 | Pope | G02F 1/133617 428/209 |
| 2003/0038587 A1 | 2/2003 | Onishi | |
| 2003/0132693 A1 * | 7/2003 | Eden | H01J 61/09 313/356 |
| 2003/0141806 A1 * | 7/2003 | Hofmann | H01J 9/242 313/497 |
| 2003/0161944 A1 * | 8/2003 | Barksdale | C23C 14/0629 427/157 |
| 2003/0230966 A1 | 12/2003 | Ozawa | |
| 2004/0058613 A1 * | 3/2004 | Hofmann | H01J 9/185 445/24 |
| 2004/0114467 A1 * | 6/2004 | Wiener-Avnear | B23K 26/389 367/180 |
| 2004/0151014 A1 * | 8/2004 | Speakman | H01L 51/0005 365/210.1 |
| 2004/0245521 A1 * | 12/2004 | Faris | B81C 1/00071 257/40 |
| 2005/0085052 A1 * | 4/2005 | Chen | B81C 1/00285 438/471 |
| 2006/0246267 A1 * | 11/2006 | Jain | H01L 21/76251 428/195.1 |
| 2007/0004080 A1 * | 1/2007 | Ouyang | H01L 51/5253 438/106 |
| 2007/0087564 A1 * | 4/2007 | Speakman | H01M 10/052 438/674 |
| 2007/0135013 A1 * | 6/2007 | Faris | H01J 43/246 445/49 |
| 2007/0138409 A1 * | 6/2007 | Daniel | G01T 1/20 250/483.1 |
| 2009/0102350 A1 * | 4/2009 | Li | H01J 29/864 313/496 |
| 2009/0127995 A1 * | 5/2009 | Rosine | H01J 43/246 313/103 CM |
| 2011/0315988 A1 * | 12/2011 | Yu | H01L 31/145 257/52 |
| 2013/0161535 A1 * | 6/2013 | Nuetzel | G02B 6/08 250/458.1 |
| 2013/0338267 A1 * | 12/2013 | Appleby | B29C 33/301 523/458 |
| 2014/0008660 A1 * | 1/2014 | Jorgenson | H01L 21/02458 257/76 |
| 2016/0082502 A1 * | 3/2016 | Appleby | C08L 63/00 164/369 |
| 2019/0164659 A1 * | 5/2019 | Smith | C23C 16/04 |

OTHER PUBLICATIONS

Nakanishi, Y., et al., "Preparation of High-Luminance Srga2s4:Eu Thin Film Phosphors by Laser Annealing," 216th ECS Meeting, Abstract #3229, The Electrochemical Society (2009).

Piedmont, J.R., and H.K. Pollehn, "High Modulation Transfer Function (MTF) Phosphor Screens," Proceedings SPIE vol. 0099, 3rd European Electro-Optics Conference(1977).

Soltani, P.K., et al., "Thin Film Phosphor Screens on Fiber Optic Faceplates," SPIE vol. 1243, Electron Image Tubes and Image Intensifiers, pp. 114 (1990).

European Search Report in Corresponding European Patent Application No. 18207219.9, dated Apr. 9, 2019.

European Office Action for related European Application No. 18207219.9; action dated Jul. 23, 2020; (4 pages).

* cited by examiner

PHOSPHOR SCREEN FOR MEMS IMAGE INTENSIFIERS

BACKGROUND

Often, image intensifiers utilize phosphor screens in their design. These phosphor screens are typically created with particle phosphor; however, the processes for creating a phosphor screen with particle phosphor is quite burdensome and often yields a phosphor screen with undesirable characteristics. For example, at a high level, particle phosphor screens are often created by adhering (i.e., gluing) phosphor particles to a fiber optics faceplate. One or more applications of adhering materials and temperature bakes may be used in this process. Then, the phosphor particles are coated with aluminum (or another such metal), which often requires multiple steps in and of itself to minimize the number of pinholes included in the aluminum layer.

For example, in order to create a uniform aluminum layer over the phosphor particles sacrificial planarizing materials may be used prior to the Aluminum deposition (and subsequently removed). Unfortunately, during this process, gas and water ends up trapped under the aluminum layer, which creates "virtual leaks" in the phosphor screen that outgas during device operation reducing the performance of the device. This is detrimental to the reliability of the image intensifier.

Due, at least in part, to the difficulties associated with depositing particle phosphor, many particle phosphor screens include substantially flat wafer structures (i.e., the aluminum or metal layer is a continuous layer that extends substantially within a flat plane that is parallel to a top surface of the fiber optics faceplate). This continuous, flat shape allows light to transfer laterally away from an initial point of contact with the phosphor screen (i.e., allows phosphor scatter) and also fails to prevent backscattered electrons from creating light away from the initial point of contact (which creates a halo effect when the electron re-enters at a different location).

Moreover, phosphor screens with particle phosphor are undesirable, if not incompatible, with Micro-Electro-Mechanical-Systems (MEMS) image intensifiers, at least because particle phosphor typically has a particle size (i.e., 2 microns in diameter) that is too large for high volume wafer scale processing. For example, vacuum seals for a MEMS image intensifier may be performed using a direct bond or bond materials that are less than 10 microns thick and linewidths that are between tens to hundreds of microns wide. Consequently, a phosphor particle with a 2 micron diameter may break a wafer on which the image intensifier is formed or prevent a vacuum seal from being formed thereon.

In view of the aforementioned issues, a phosphor screen for MEMS image intensifiers that does not include particle phosphor (and, thus, is compatible with wafer scale processing) is desired. Such a phosphor screen may be especially desirable if the phosphor screen can reduce backscattered electrons, minimize photon scatter, and/or reduce the amount of unintended virtual leaks (i.e., unintended gasses in the vacuum space) included in the phosphor screen (i.e., as compared to phosphor screens formed with phosphor particles).

SUMMARY

According to one embodiment, a phosphor screen for a Micro-Electro-Mechanical-Systems (MEMS) image intensifier includes a wafer structure, a lattice of interior walls, a thin film phosphor layer, and a reflective metal layer. The wafer structure has a naturally opaque top layer and an active area defined within the naturally opaque top layer. The lattice of interior walls is formed, within the active area, from the naturally opaque top layer. The thin film phosphor layer is disposed in the active area, between the lattice of interior walls. The reflective metal layer that is disposed atop the thin film phosphor layer. In at least some instances, the thin film phosphor layer is a non-particle phosphor layer.

According to another embodiment, a phosphor screen for a MEMS image intensifier includes a wafer structure, a lattice of depressions, a non-particle phosphor layer, and a reflective metal layer. The wafer structure has an active area and the lattice of depressions is formed within the active area. The non-particle phosphor layer is disposed in the depressions and the reflective metal layer is disposed atop the phosphor layer.

According to yet another embodiment, a method of forming a phosphor screen for a microelectromechanical image intensifier includes creating a pattern of pixels in an active area of a naturally opaque top layer of a wafer. A phosphor layer is grown across the pattern of pixels and the phosphor layer is annealed. A reflective metal is deposited over the phosphor layer.

BRIEF DESCRIPTION OF THE DRAWINGS

Like reference numerals have been used to identify like elements throughout this disclosure.

DETAILED DESCRIPTION

Figure 1:
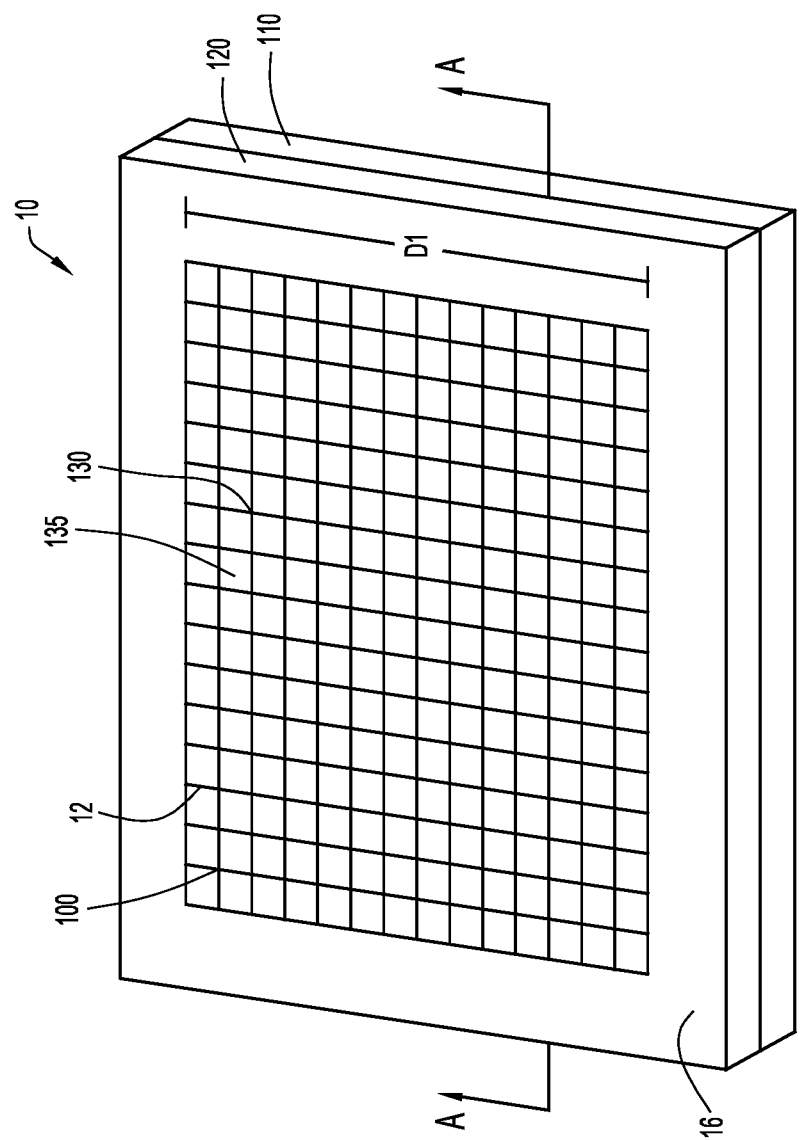
FIG. 1 illustrates a perspective view of a die including a phosphor screen for a Micro-Electro-Mechanical-Systems (MEMS) image intensifier, according to an example embodiment of the present invention.

A phosphor screen for a Micro-Electro-Mechanical-Systems (MEMS) image intensifiers is presented herein. The phosphor screen includes a thin film of phosphor that is formed (i.e., deposited) on a wafer structure with a lattice of interior walls that form a plurality of cells or pixels. Notably, the phosphor screen does not include phosphor particles and, instead, includes a thin film phosphor layer. Consequently, the phosphor screen is compatible with wafer scale processing. The cells/pixels include or define open-top depressions or cavities and the phosphor layer is deposited on at least a bottom surface of each depression or cavity.

Advantageously, the lattice of interior walls contains or captures backscattered electrons. Moreover, since the phosphor layer is a non-particle layer (that is, since the phosphor layer does not include any phosphor particles), the phosphor screen is substantially thinner than typical phosphor layers. For example, the phosphor layer of the phosphor screen presented herein may be a thin phosphor film with a thickness of 200 nanometers (nm). By comparison, phosphor particles typically have a diameter of 2 microns (i.e., 2,000 nm), which is approximately 10 times larger than the thickness of the thin phosphor film included in the phosphor screen presented herein. Consequently, the phosphor screen presented herein may reduce photon scatter as compared to phosphor screens with phosphor particles. Moreover, the non-particle phosphor layer defines a substantially flat or planar top surface and, thus, a reflective metal layer can be deposited directly onto the phosphor layer without any evaporation operations (i.e., lacquer need not be applied and removed during formation of the phosphor screen). This minimizes the amount of unintended "virtual leaks" (i.e., unintended vacuum space) included in the phosphor screen, especially as compared to phosphor screens that include an irregular phosphor layer, such as those utilizing particle phosphor.

As mentioned, the phosphor screen presented herein is suitable for MEMS image intensifiers. As a brief example, the phosphor screen presented herein may be formed on 70-100 dies of a wafer for an image intensifier of night vision goggles. This phosphor screen may provide performance advantages that allow a system including the phosphor screen to be substantially smaller and lighter than systems including particle-based phosphor screens and, thus, may allow an image intensifier and/or a pair of night vision googles to be substantially smaller, in size and weight, than those incorporating particle-based phosphor screens. Moreover, the thin film phosphor layer may be approximately one-tenth the size of phosphor layers formed from phosphor particles. When the phosphor screen presented herein is included in night vision goggles, the phosphor screen may convert amplified electrons back into visible light (after other components of the goggles/image intensifier convert photons received from ambient light to electrons and amplify the electrons). The efficiency of the phosphor screen presented allows the phosphor screen to output visible light that can be viewed in a direct view system (i.e., a system where a user looks directly at the phosphor for an image) or a digital system (i.e., a system where a user views a digital output from a camera focused on the phosphor screen).

Now turning to FIG. 1, this figure illustrates a perspective view of a die 10 including an example embodiment of a phosphor screen 100 for a MEMS image intensifier. The phosphor screen 100 is included in active area 12 (also referred to as an imagining area 12) of the die 10, which in the perspective embodiment is a square with a height and width of dimension D1. More specifically, in the depicted example, the active area 12 is a square area that is approximately 14 millimeters (mm) by 14 mm (i.e., D1 is 14 mm). However, in other embodiments, the active area 12 may be any shape and size.

Regardless of the shape and size of the active area 12, the active area 12 is bounded by an external band 16 that allows the die to be secured and sealed to additional components (i.e., to additional wafers with a vacuum seal). In the depicted embodiment, the external band 16 is formed from a silicon layer 120. In fact, in the depicted embodiment, the die 10 is a portion of a wafer 110, such as a glass wafer, with a silicon layer 120 formed atop the wafer 110. The silicon layer 120 may be formed atop the wafer 110 with any techniques now known or developed hereafter, such as etchback bonding, thinning, and/or deposition. Moreover, the silicon layer 120 may be bonded to the wafer 110 with any bond (e.g., an anodic bond, a crypt bond, etc.). Collectively, the wafer 110 and the silicon layer 120 may be referred to as the wafer structure, with the silicon layer 120 forming a top layer of the wafer structure.

Notably, the wafer structure includes a lattice of interior walls 130. The lattice of interior walls 130 is formed from the silicon 120 (in the active area) and can be by selectively adding or removing materials to the active area 12. In particular, the lattice of interior walls 130 is formed in the active area 12 by adding silicon 120 to the wafer 110 in a specific pattern and/or by bonding silicon 120 to the wafer 110 and selectively removing silicon 120 from the wafer 110. For example, in some embodiments, the silicon layer 120 is deposited into the active area 12 and patterned with lithography techniques, such as by patterning a silicon on insulator (SOI) wafer (which includes a thin layer of silicon separated from a handle wafer by an oxide), bonding the silicon of the SOI wafer to the wafer 110, and etching off the handle wafer to expose the lattice of interior walls 130. By comparison, in other embodiments, a uniform layer of silicon 120 is formed atop of the glass wafer 100 and then the silicon 120 is selectively removed in order to form the lattice of interior walls 130. Put generally, the wafer structure can be formed in any manner that defines a lattice of interior walls 130 in the active area 12.

Moreover, regardless of how the lattice of interior walls 130 is formed, the lattice of interior walls 130 will be naturally opaque because silicon is naturally opaque. Consequently, the walls 130 do not need to be coated (or overcoated) with reflective and/or absorptive material. That is, due to their natural opacity, the lattice of interior walls 130 (which is formed from the silicon 120) will absorb and/or reflect light and prevent, or at least minimize, the deleterious effects of backscattered electrons. Put still another way, the naturally opaque lattice of interior walls 130 do not require any modifications, such as a treatment to create a reflective layer, to prevent light from traveling through the walls 130, between cells or pixels 135 defined by the lattice of interior walls 130.

Figure 2:
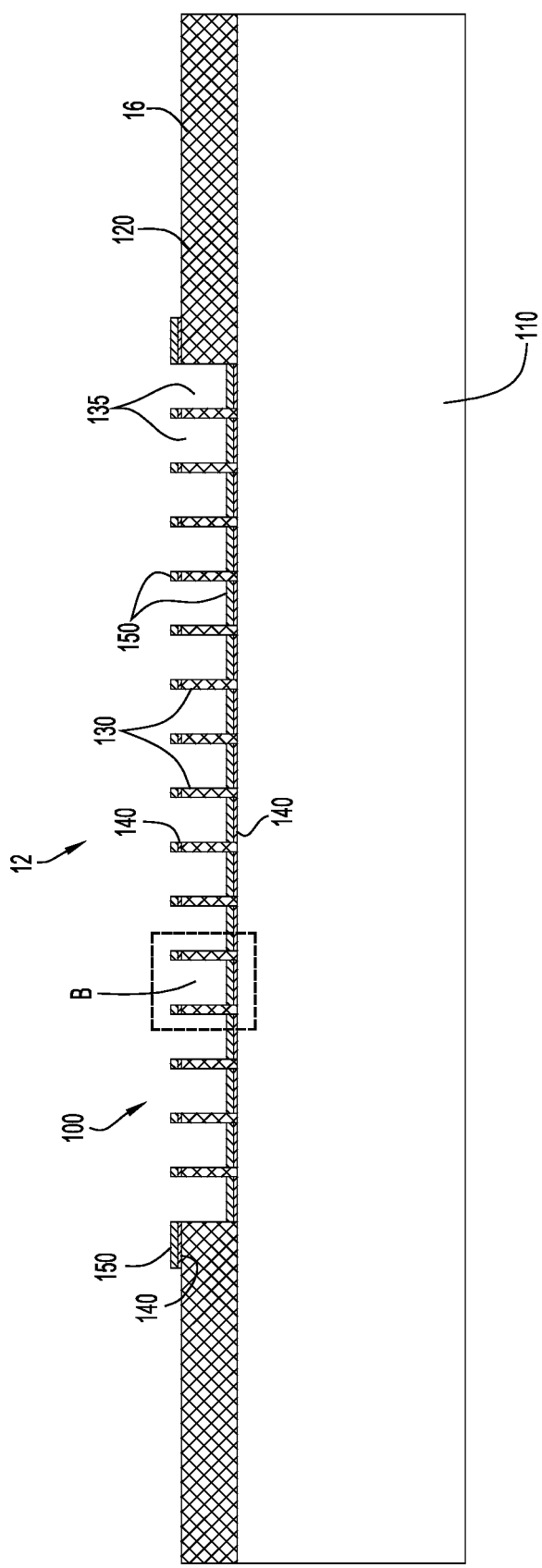
FIG. 2 illustrates a cross-sectional view of the die of FIG. 1 taken along line A-A from FIG. 1.
Figure 3:
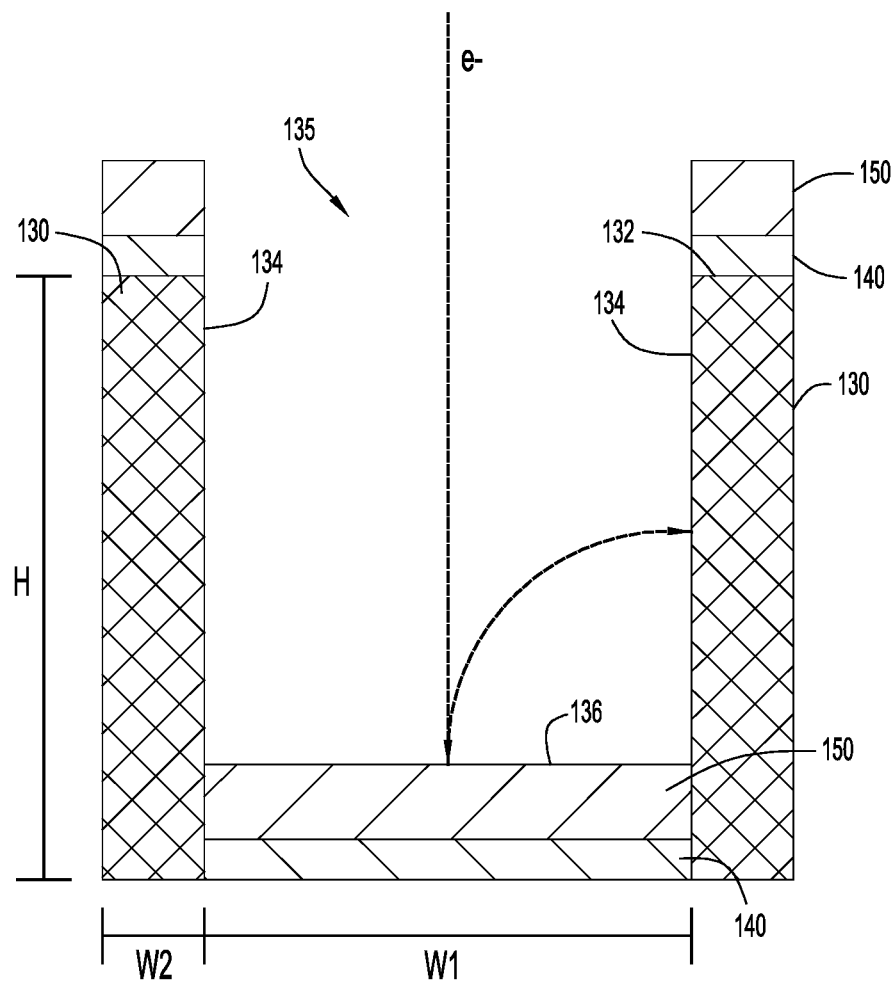
FIG. 3 illustrates a close-up view of inset B from FIG. 2.

FIGS. 1-3 are now referred to for a description of the pixels 135. Generally, the lattice of interior walls 130 defines a pattern of pixels or cells 135 within the silicon layer 120. However, the pixels 135 do not actually include any silicon therein; the bottom of the pixel is initially formed from the wafer 110 and eventually covered with the thin phosphor film 140 and the reflective metal layer 150. Put another way, the silicon 120 is removed from a bottom 136 of each pixel 135. Thus, when the pixels 135 are described as being formed in the silicon 120, this is intended to mean that the pixels 135 are formed between walls 130 that are formed from the silicon 120 and are simply disposed, in large part, in alignment with the silicon layer 120.

In the depicted embodiment, the pixels 135 are uniform pixels. That is, the pixels 135 are patterned in a regular, repeating pattern, insofar as the pixels 135 each have the same dimensions and are separated by the same distance. For example, each pixel 135 may have a square bottom surface 136 with a length and width (depicted as W1 in FIG. 3) in the range of approximately 4 microns to approximately 6 microns. Meanwhile, each pixel 135 may have a height (depicted as H in FIG. 3) in the range of approximately 4 microns to approximately 10 microns and each wall 130 may have a thickness of approximately 0.3 microns so that adjacent pixels 135 are separated by a distance of approximately 0.3 microns (depicted as W2 in FIG. 3). Notably, the height (i.e., H from FIG. 3) of the pixels may be substantially shorter than similar structures used with particle phosphor, at least because the film phosphor layer 140 is substantially thinner (i.e., has a shorter height) than a particle-based phosphor layer, as is discussed in further detail below.

When the phosphor screen 100 is formed with the aforementioned dimensions, the phosphor screen 100 may have an open area ratio of approximately 88%. That is, the pixels 135 may cover approximately 88% of the phosphor screen's normal surface area (the surface area seen from a normal position relative to the phosphor screen 100 (the top of the page in the Figures when viewed in landscape)). However, in other embodiments, the open area ratio may be in the range of approximately 80% to 95%. Higher open area ratios may serve to more effectively reduce backscattered electrons (since higher open area ratios reduce the chance of an electron impacting a top surface 132 (see FIG. 3) of a wall 130), but the open area ratio must also be balanced against the structural integrity of the lattice of interior walls 130 and the size of the pixels 135. Notably, wall thickness and pixel size may control the open area ratio, but thinner walls may be more unstable and larger pixels 135 may be less effective in preventing backscattered electrons from re-impacting a phosphor layer 140 included at a bottom 136 (see FIG. 3) of the pixel 135.

Now referring to FIGS. 2 and 3, these figures illustrate a cross sectional view of the die 10 taken along line A-A from FIG. 1 and a close-up view of a portion B from FIG. 2, respectively. These figures depict the thin film of phosphor 140, which is disposed across the pattern of pixels 135 defined by the lattice of interior walls 130, insofar as the term "across" signifies that that the phosphor layer 140 is disposed at least between any and all interior walls of the lattice of interior walls 130. That is, the phosphor layer 140 is disposed on at least the bottom surface 136 of each of the cells/pixels 135 that are defined by the lattice of interior walls 130, so that the phosphor film 140 covers at least a portion of the active area 12 equivalent to the open area ratio (i.e., 80-95%) when the phosphor screen is viewed from a direction normal to the major dimension of the phosphor screen 100 (i.e., from a top of the page in the Figures when viewed in landscape).

That being said, often deposition techniques cannot distinguish between the walls 130 and the pixels 135 and, thus, the layer of phosphor 140 may be disposed between the lattice of walls 130 and atop the lattice of walls 130. That is, the phosphor film 140 may be deposited on a bottom surface 136 of each pixel 135 and a top surface 132 of each wall 130, as is clearly shown in FIG. 3, so that the phosphor film 140 covers 100% of the active area, when the phosphor screen is viewed from a direction normal to the major dimension of the phosphor screen 100 (i.e., from a top of the page in the Figures when viewed in landscape).

Still further, in some embodiments, the phosphor layer 140 may also coat the sidewalls 134 of any walls 130, thereby completing coating any surfaces defining a pixel 135. For example, if the phosphor layer 140 is formed via atomic layer deposition, the phosphor layer 140 may coat the bottom 136 and all four sidewalls 134 surrounding the bottom 136. For clarity, side walls 134 that are normal to the sectional view (i.e., walls of pixel 135 that would be considered back walls from the perspective of the sectional view) are omitted from FIGS. 2 and 3; however, it is to be understood that the sidewalls 134 may substantially surround or bound the bottom 136 of each pixel 135, as is shown in FIG. 1. Moreover, the sidewalls 134 may extends substantially perpendicular to the bottom 136 (i.e., the sidewalls 134 may be substantially vertical sidewalls 134) so that each pixel 135 is essentially an open-top cavity or depression. Additionally or alternatively, the shape of each pixel 135 may be described as a pit or trench.

Despite the mention of atomic layer deposition above, the non-particle phosphor layer 140 may be formed across the lattice of interior walls 130 with any number of deposition techniques suitable for depositing a non-particle phosphor film with a suitable height that ensures electron energy is deposited into the non-particle phosphor layer. A suitable height may be any height greater than a penetration range of incoming electrons. The penetration range may depend upon the energy of an incoming electron and a density of the phosphor, with the relationship being defined by the equation $$R_P = \frac{0.1 V_{landing}^{1.5}\{kV\}}{\rho\{g/cm^3\}}\{\mu m\},$$

with ρ representing phosphor density, V representing energy of the incoming electron and $R_p$ representing the penetration range. That being said, the thickness of the phosphor should also be minimized in view of the penetration range to minimize deleterious effects on screen resolution ($R_L$), which is defined by the equation $$R_L = \frac{500}{\text{Thickness }\{\mu m\}}\{lp/mm\}.$$

As a more concrete example, when electron energy is absorbed over approximately 200 nm (i.e., penetration range is 200 nm, which may be most common), the height of the non-particle phosphor film 140 is in the range of approximately 200 nm to 300 nm. Consequently, the thin film 140 is sufficient to absorb electron energy and convert the energy to visible light. Moreover, this height (i.e., thickness of the film) may be approximately one-tenth the size of phosphor layers formed from phosphor particles and the reduced height of the phosphor layer 140, which, to reiterate, is a non-particle phosphor film, may serve to reduce photon scatter within the phosphor layer (i.e., as compared to a particle-based phosphor layer).

Still referring to FIGS. 2 and 3, a layer of reflective metal 150 is disposed atop the layer of phosphor 140. That is, the layer of phosphor 140 is coated with a reflective metal layer 150. The reflective metal layer 150 may be a layer of aluminum, magnesium, beryllium, and/or any other conductive and reflective metals (i.e., metals with low atomic numbers) and can be formed directly atop of the phosphor layer 140, without any evaporation techniques. That is, the reflective metal layer 150 can be deposited directly onto a top surface of the phosphor layer 140 without applying a lacquer in between the two depositions (and without subsequently attempting to remove the lacquer via heating). The reflective layer 150 can be formed directly atop of the phosphor layer 140 because the phosphor layer 140 forms a substantially planar top surface (i.e., a substantially flat top surface), albeit a discontinuous planar top surface (i.e., the top surface is actually a plurality of planar top surface segments, separated by the lattice of walls 130). Forming the reflective layer 150 directly atop of the phosphor layer 140 creates substantially fewer pinholes, virtual leaks, and trapped gas, as compared to techniques that apply and subsequently remove (i.e., burn out) a lacquer or other such substance.

Now referring to FIG. 3, the overall structure of the lattice of interior walls 130 (and the pixels 135 formed by the interior walls) substantially reduces electron scatter. When electrons are bombarded against any phosphor screen, at least some of the electrons will bounce away from the phosphor screen (i.e., backscatter), but the phosphor screen presented herein reduces or eliminates the negative impact of this backscattering (i.e., the phosphor screen presented herein reduces or eliminates the "halo effect"). The phosphor screen 100 prevents the negative impact because the lattice of interior walls 130 prevents the electrons from traveling laterally into another pixel 135. Instead, and as is shown in FIG. 3, a backscattered electron will be absorbed into one of the sidewalls 134 or reflect off of one of the sidewalls 134 (which directs a backscattered electron away from the phosphor layer 140).

Figure 4:
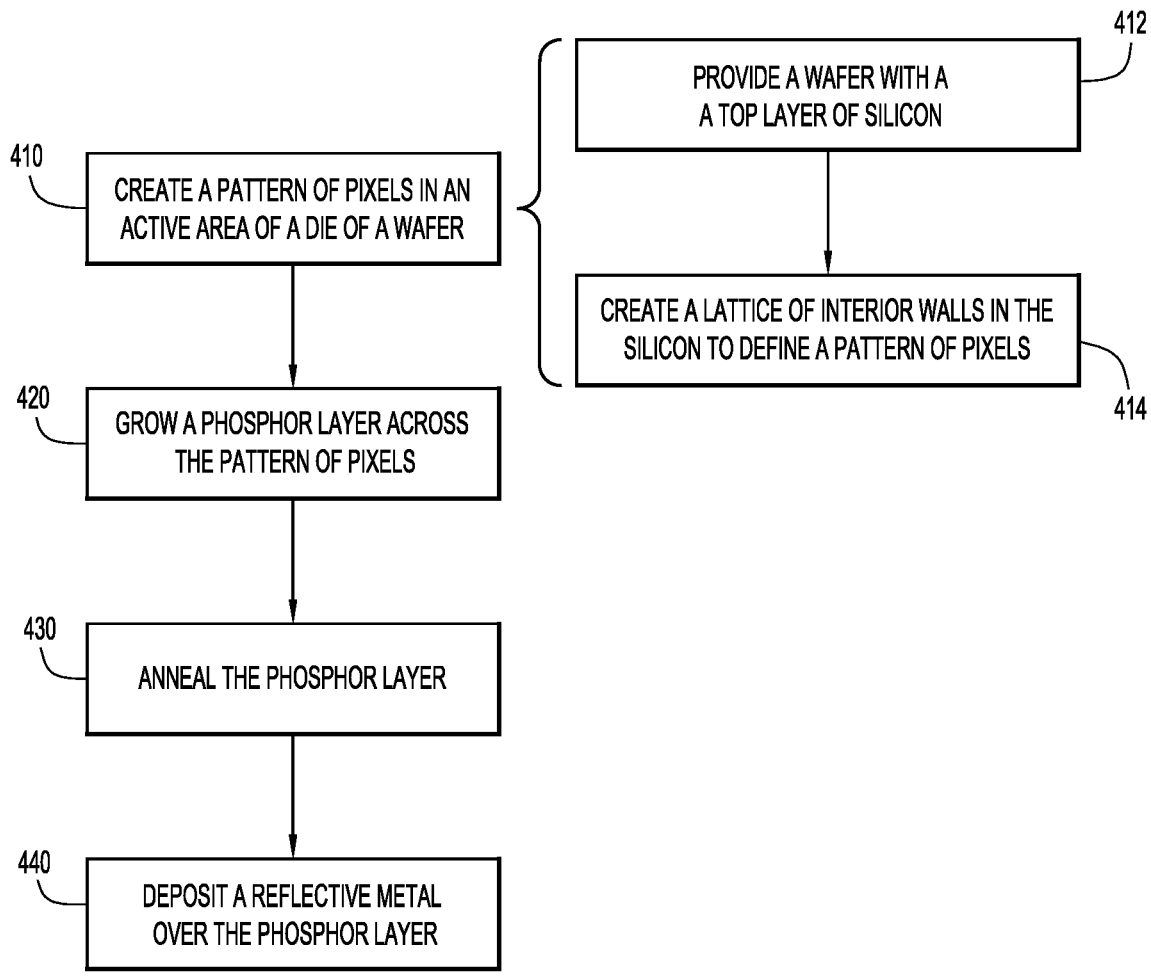
FIG. 4 illustrates a high-level flow chart of a method for forming a phosphor screen for a MEMS image intensifier, according to an example embodiment of the present invention.

FIG. 4 illustrates a high-level flow chart of a method for forming a phosphor screen for a MEMS image intensifier, according to an example embodiment of the present invention. Initially, at step 410, a pattern of pixels is created in an active or imaging area of a die of a wafer. As is shown at 412 and 414 (and as is described above), in some embodiments, forming the pixels involves providing a wafer with a top layer of silicon and creating a lattice of walls in the silicon to define a pattern of pixels. As is described above, in various embodiments, a silicon layer may be deposited on and/or bonded to (i.e., anodically bonded) a wafer, such as a glass wafer, and the lattice of interior walls may be formed with various lithography and/or deposition techniques.

At 420, a layer of phosphor is grown or formed across the lattice of pixels. As is described above, the layer of phosphor is a non-particle phosphor and is applied with any deposition techniques now known or developed hereafter. Consequently, in growing the layer of phosphor across the lattice of pixels, the layer of phosphor may be deposited at the bottom of each pixel and may also be deposited atop of each wall in the lattice of walls. In fact, in some embodiments (i.e., those embodiments in which the phosphor layer is deposited with atomic layer deposition), the phosphor layer may also be deposited on the side walls of each wall in the lattice of walls.

At 430, the phosphor layer is annealed. The annealing crystallizes the phosphor layer and ensures that the phosphor layer has a good phosphor efficiency (so that the phosphor layer converts as much energy from an electron thereon into light). The annealing may require the phosphor layer to be heated to a temperature in the range of 600-900° C. Notably, since the lattice of interior walls (absorbers/reflectors) is formed with Silicon rather than glass overcoated with aluminum, the interior walls may allow for a higher anneal point, at least in comparison to glass overcoated with aluminum. This higher anneal point may improve phosphor efficiency (which, in turn, creates visible light suitable for direct viewing or digital applications). By comparison, if glass overcoated with aluminum is annealed at temperatures in the range of 600-900° C., the aluminum may melt and/or diffuse into the glass (since aluminum melts at 660° C.). Consequently, glass overcoated with aluminum is annealed at lower temperatures that produce a lower phosphor efficiency.

At 440, a reflective metal layer is deposited over the annealed phosphor layer. As mentioned above, the reflective metal layer may be a layer of aluminum, magnesium, beryllium, and/or any other conductive and reflective metals (i.e., metals with low atomic numbers) and may cover any phosphor layer deposited into the pixels or onto the lattice of interior walls. For example, if the phosphor layer is deposited with atomic layer deposition techniques, the reflective metal layer may be deposited over the phosphor film disposed at the bottom of a pixel (i.e., item 136 of FIG. 3), the side walls defining the pixel (i.e., items 134 of FIG. 3), and the top of the interior walls forming the pixel (i.e., item 132 of FIG. 3). When the reflective metal layer is deposited onto all of these surfaces, the reflective metal layer may be connected electrically across the active area; however, in embodiments where the phosphor layer (and, thus, the reflective metal layer) is only disposed at the bottom of the pixels and/or the tops of the interior walls, the portions of reflective metal layer may each be electrically insulated.

To summarize, in one form, a phosphor screen for a microelectromechanical image intensifier is provided, comprising: a wafer structure with a naturally opaque top layer and an active area defined within the naturally opaque top layer; a lattice of interior walls is formed from the naturally opaque top layer within the active area; a thin film phosphor layer that is disposed in the active area between the lattice of interior walls; and a reflective metal layer that is disposed atop the thin film phosphor layer.

In another form, a method of forming a phosphor screen for a microelectromechanical image intensifier is provided, comprising: creating a pattern of pixels in an active area of a naturally opaque top layer of a wafer; growing a phosphor layer across the pattern of pixels; annealing the phosphor layer; and depositing a reflective metal over the phosphor layer.

In yet another form, a phosphor screen for a microelectromechanical image intensifier is provided, comprising: a wafer structure with an active area; a lattice of depressions formed within the active area; a non-particle phosphor layer that is disposed in the depressions; and a reflective metal layer that is disposed atop the phosphor layer.

The phosphor screen presented herein provides a number of advantages. For example, as is discussed above, the wafer structure (i.e., the structure of the glass wafer and silicon that forms the lattice of interior walls and pattern of pixels) captures backscattered electrons, which improves the image fidelity (i.e., as measured via the modulation transfer function) of the phosphor screen. The wafer structure may also be conductive to draining charge away from the phosphor screen and improve phosphor efficiency (i.e., by allowing for a higher anneal point).

As another example, due, at least in part, to the thin film phosphor layer, the phosphor screen presented herein may reduce photon scatter (at least as compared to particle-based phosphor screens) and, thus, may improve image fidelity (i.e., as measured via the modulation transfer function) by eliminating phosphor cross talk between pixels. Still further, the phosphor screen presented herein may reduce or eliminate virtual leaks because there is no evaporation processing necessary to form a reflective metal layer atop of phosphor particles (which define an irregular top surface). Instead, reflective metal can be applied (i.e., deposited) directly to a flat top surface of the thin film phosphor layer. That being said, prior to forming the phosphor layer, reflective metal need not be applied to the wafer structure at least because the silicon interior walls are naturally opaque.

As a final example, since the phosphor screen presented herein does not include phosphor particles, the phosphor screen is compatible with wafer scale processing and hermetic sealing. Consequently, the phosphor screen can be rapidly produced at scale and quickly and efficiently incorporated into various imaging products, such as night vision goggles or scopes. In fact, the phosphor screens presented herein may improve these imaging products by providing a size and weight reduction as compared to particle-based phosphor screens. The phosphor screen may also provide a performance improvement for both digital and analog solutions by improving the image fidelity of the image produced by the phosphor screen.

It is to be understood that terms such as "left," "right," "top," "bottom," "front," "rear," "side," "height," "length," "width," "upper," "lower," "interior," "exterior," "inner," "outer" and the like as may be used herein, merely describe points or portions of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment of the invention.

Although the disclosed inventions are illustrated and described herein as embodied in one or more specific examples, it is nevertheless not intended to be limited to the details shown, since various modifications and structural changes may be made therein without departing from the scope of the inventions and within the scope and range of equivalents of the claims. For example, in some embodiments, the wafer described herein may be a fiber optic wafer that is masked and etched to form the lattice of interior walls. In these embodiments, the lattice of interior walls may then need to be coated in reflective and/or conductive material in order to ensure that the interior walls are sufficiently opaque to contain backscattered electrons. Then, a thin film phosphor and reflective material may be formed in pixels formed by the lattice of walls in the same manner as described above.

In addition, various features from one of the embodiments may be incorporated into another of the embodiments. Accordingly, it is appropriate that the appended claims be construed broadly and in a manner consistent with the scope of the disclosure as set forth in the following claims.

What is claimed:

1. A phosphor screen for a microelectromechanical image intensifier, comprising:
   a wafer structure with a naturally opaque top layer and an active area defined within the naturally opaque top layer;
   a lattice of interior walls formed from the naturally opaque top layer to define a plurality of pixels within the active area;
   a thin film phosphor layer that is disposed directly on a bottom of each pixel of the plurality of pixels, between the lattice of interior walls; and
   a reflective metal layer that is disposed atop the thin film phosphor layer, wherein the phosphor screen is configured to receive a plurality of electrons from a component spaced apart from the phosphor screen and the interior walls extend above the reflective metal layer so that the interior walls can absorb or reflect one or more electrons, of the plurality of electrons, that backscatter in one of the plurality of pixels, thereby preventing the one or more electrons from traveling laterally into another pixel of the plurality of pixels,
   wherein the thin film phosphor layer has a thickness in the range of approximately 200-300 nanometers,
   wherein the thin film phosphor layer is annealed at a temperature in a range of 600° C. to 900° C.

2. The phosphor screen of claim 1, wherein the thin film phosphor layer is a non-particle phosphor layer.

3. The phosphor screen of claim 1, wherein the bottom of each pixel is a planar surface bounded by approximately vertical sidewalls.

4. The phosphor screen of claim 1, wherein the wafer structure comprises:
   a glass wafer; and
   a silicon layer bonded to a top surface of the glass wafer, the silicon layer forming the naturally opaque top layer.

5. The phosphor screen of claim 4, wherein the silicon layer is removed from the bottom of each pixel of the plurality of pixels.

6. The phosphor screen of claim 5, wherein the plurality of pixels is provided in a regular, repeating pattern.

7. The phosphor screen of claim 1, wherein the lattice of interior walls creates an open area ratio in the range of approximately 80-95%.

8. The phosphor screen of claim 1, wherein the thin film phosphor layer defines a planar top surface and the reflective metal layer is deposited directly onto the planar top surface without an evaporation operation.

9. The phosphor screen of claim 1, wherein the interior walls are uncoated interior walls.

10. A method of forming a phosphor screen for a microelectromechanical image intensifier, comprising:
    creating a pattern of pixels by forming a lattice of interior walls in an active area of a naturally opaque top layer of a wafer;
    growing a phosphor layer directly on a bottom of each pixel of the pattern of pixels;
    annealing the phosphor layer; and
    depositing a reflective metal over the phosphor layer, wherein the phosphor screen is configured to receive a plurality of electrons from a component spaced apart from the phosphor screen and the interior walls extend above the reflective metal layer so that the interior walls can absorb or reflect one or more electrons, of the plurality of electrons, that backscatter in one of the pattern of pixels, thereby preventing the one or more electrons from traveling laterally into another pixel of the pattern of pixels,
    wherein the phosphor layer has a thickness in the range of approximately 200-300 nanometers,
    wherein the phosphor layer is annealed at a temperature in a range of 600° C. to 900° C.

11. The method of claim 10, wherein the phosphor layer is a non-particle phosphor layer.

12. The method of claim 10, wherein the naturally opaque top layer is a silicon layer.

13. The method of claim 12, wherein creating the pattern of pixels further comprises:
    etching the silicon layer to remove material from the silicon layer and define the lattice of interior walls.

14. The method of claim 10, further comprising:
    depositing the phosphor layer atop the lattice of interior walls.

15. The method of claim 10, wherein depositing the reflective metal layer further comprises:
    depositing the reflective metal layer directly onto a planar top surface of the phosphor layer without an evaporation operation.

16. The method of claim 10, wherein the interior walls are uncoated walls.

17. A phosphor screen for a microelectromechanical image intensifier, comprising:
    a wafer structure with an active area;
    a lattice of depressions formed in a naturally opaque top layer of the wafer within the active area so that the naturally opaque layer defines a plurality of pixels, wherein each depression in the lattice of depressions includes a bottom and a plurality of side walls;
    a non-particle phosphor layer that is disposed directly on the bottom of each of the depressions; and a reflective metal layer that is disposed atop the phosphor layer, wherein the phosphor screen is configured to receive a plurality of electrons from a component spaced apart from the phosphor screen and the plurality of side walls extend above the reflective metal layer so that the plurality of side walls can absorb or reflect one or more electrons, of the plurality of electrons, that backscatter in one of the plurality of pixels, thereby preventing the one or more electrons from traveling laterally into another pixel of the plurality of pixels, wherein the non-particle phosphor layer has a thickness in the range of approximately 200-300 nanometers, wherein the non-particle phosphor layer is annealed at a temperature in a range of 600° C. to 900° C.

18. The phosphor screen of claim 17, wherein the non-particle phosphor layer is deposited onto the plurality of side walls of each depression.

19. The phosphor screen of claim 17, wherein the side walls are uncoated walls.

\* \* \* \* \*